(12) United States Patent
Santana, Jr. et al.

(10) Patent No.: US 6,507,044 B1
(45) Date of Patent: *Jan. 14, 2003

(54) POSITION-SELECTIVE AND MATERIAL-SELECTIVE SILICON ETCHING TO FORM MEASUREMENT STRUCTURES FOR SEMICONDUCTOR FABRICATION

(75) Inventors: Miguel Santana, Jr., Austin, TX (US); Markangelo S. D'Souza, Austin, TX (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/277,024

(22) Filed: Mar. 25, 1999

(51) Int. Cl.$^7$ ................................. H01L 23/58
(52) U.S. Cl. ............. 257/48; 438/10; 438/11
(58) Field of Search ............. 250/307; 257/48, 257/301, 516, 68, 71, 296, 300, 306, 368; 438/11, 14, 15, 18

(56) References Cited

U.S. PATENT DOCUMENTS

| | | | |
|---|---|---|---|
| 5,266,820 A | * 11/1993 | Van Berkel | 257/300 |
| 5,270,552 A | * 12/1993 | Ohnishi et al. | 250/307 |
| 5,332,688 A | * 7/1994 | Hashimoto et al. | 437/57 |
| 5,589,693 A | * 12/1996 | Chiu | 257/48 |
| 5,945,349 A | * 8/1999 | Koo | 438/694 |
| 5,970,339 A | * 10/1999 | Choi | 438/243 |
| 6,033,994 A | * 3/2000 | Tikhonov | 438/746 |
| 6,037,607 A | * 3/2000 | Hause et al. | 257/48 |
| 6,048,745 A | * 4/2000 | Landers et al. | 438/16 |
| 6,069,388 A | * 5/2000 | Okusa et al. | 257/347 |
| 6,121,156 A | * 9/2000 | Shamble et al. | 438/734 |

FOREIGN PATENT DOCUMENTS

| | | | | |
|---|---|---|---|---|
| JP | 404243146 A | * | 8/1992 | 21/66 |
| JP | 404243147 A | * | 8/1992 | 21/66 |

OTHER PUBLICATIONS

Abramo et al. Reactive Ion Etching for Failure Analysis Applications. Reliability Physics Symposium. 1992. 30th Annual Proceedings, International.*

Stephen A. Campbell. The Secience And Engineering of Microelectronic Fabrication. pp. 25. Oxford University Press, 1996.*

Chu et al., "Controlled Pulse–Etching with Xenon Difluoride," 9th International Conference on Solid State Sensors & Actuators, Jun. 1997.

* cited by examiner

Primary Examiner—Steven Loke
Assistant Examiner—Douglas W. Owens
(74) Attorney, Agent, or Firm—Kevin L. Daffer; Conley, Rose & Tayon P.C.

(57) ABSTRACT

A method for position-selective and material-selective etching of silicon, and examination structures formed using the method, are presented. A semiconductor topography is exposed to an electron beam in the presence of xenon difluoride ($XeF_2$) gas. The beam is scanned over a portion of the semiconductor topography, and silicon portions of the topography contacted by the electron beam and the $XeF_2$ gas are etched. Non-silicon portions, such as dielectrics, metals, and/or metal silicides, are not believed to be etched. Shorter exposure times may be used to remove polycrystalline silicon portions of a topography, while leaving monocrystalline silicon portions intact. Removal of silicon and non-silicon portions of the topography by other means may be used to expose silicon portions of the topography. The electron beam controlled etching recited herein may be used alone or combined with such removal by other means to form examination structures for use in evaluation of semiconductor manufacturing techniques.

20 Claims, 5 Drawing Sheets

POSITION-SELECTIVE AND MATERIAL-SELECTIVE SILICON ETCHING TO FORM MEASUREMENT STRUCTURES FOR SEMICONDUCTOR FABRICATION

BACKGROUND OF THE INVENTION

1. Field of the Invention

This invention relates to integrated circuit manufacturing and more particularly to position-selective and material-selective etching of silicon.

2. Description of the Relevant Art

Fabrication of an integrated circuit is a complex process involving numerous steps. To form a metal-oxide-semiconductor (MOS) transistor, for example, a gate dielectric is formed on a semiconductor substrate which is doped with either n-type or p-type impurities. A gate conductor is formed over the gate dielectric, and dopant impurities are introduced into the substrate to form a source and drain. Such transistors are connected to each other and to terminals of the completed integrated circuit using conductive interconnect lines.

A pervasive trend in modern integrated circuit manufacture is to produce transistors having feature sizes as small as possible. Many modern day processes employ features, such as gate conductors and interconnects, which have less than 0.3 $\mu$m critical dimension. As feature size decreases, the sizes of the resulting transistors as well as those of the interconnects between transistors also decrease. Fabrication of smaller transistors allows more transistors to be placed on a single monolithic substrate, thereby allowing relatively large circuit systems to be incorporated on a single, relatively small die area.

This trend toward reduced feature sizes imposes severe demands on the reliable operation of the resulting transistors or other electronic devices. Reduction of feature sizes necessitates a "scaling" down of many device dimensions. As gate conductor widths decrease, for example, other transistor dimensions must also decrease in order to maintain proper transistor operation. Early MOSFET scaling techniques involved decreasing all dimensions and voltages by a constant scaling factor, to maintain constant electric fields in the device as the feature size decreased. This approach has given way to more flexible scaling guidelines which account for operating characteristics of short-channel devices. For example, a maximum value of MOSFET subthreshold current can be maintained while feature sizes shrink, by decreasing any or all of several quantities, including gate oxide thickness, operating voltage, depletion width, and junction depth, by appropriate amounts. Such reductions in device dimensions greatly increase the manufacturing accuracy required to form devices which operate properly.

One area of a modern transistor at risk for reliability problems is the gate dielectric. Gate dielectric thicknesses are continually decreasing, driven in part by the device scaling described above. The increased transistor drive current which can be achieved with thinner gate dielectrics is another reason for decreases in gate dielectric thickness. Current gate dielectric thicknesses are therefore typically a few tens of angstroms, or less. Such thin dielectric films are susceptible to breakdown when subjected to the electric fields applied across the gate dielectric during transistor operation. Pinholes or thickness nonuniformities occurring in the gate dielectric are especially likely to cause dielectric breakdown.

Other areas of a transistor in which reliability problems may occur are the contacts made to silicon-based portions of the transistor. The source and drain of the transistor are junctions formed in a silicon substrate, and the transistor gate is typically formed from polycrystalline silicon, or polysilicon. To help in forming a low-resistance contact to such a source, drain or gate region, a metal silicide is often formed on the upper surface of the region. Such a silicide is formed by depositing a metal, typically titanium or cobalt, over the surface of the silicon on which the silicide is to be formed. The substrate is then heated so that the metal reacts with underlying silicon to form a silicide. Modern transistors employ increasingly shallow source and drain junctions to comply with scaling requirements. It is therefore important in many applications that the thickness of a silicide formed at the surface of such a junction be controlled so that the silicide does not extend down through the entire source or drain region, causing a short circuit of the source or drain to the substrate. A high degree of control over the silicide formation process is therefore required.

In order to maintain reliable circuit operation and acceptable yields of working circuits in light of the problems which may be caused or exacerbated by shrinking feature sizes, the ability to carefully examine device structures is important. The device structures examined may be actual devices at various stages of manufacture, or may be test structures used to optimize particular subprocesses involved in the fabrication. Actual imaging of the device structures examined is particularly desirable in many cases. For example, imaging of the corresponding portions of a device is well-suited to observation of quantities such as layer thickness, thickness uniformity, and interface structure. Surface morphology of a layer in a device structure may also be examined using imaging techniques. For example, pinholes in an oxide layer may be visible by imaging of the surface of the layer.

One of the highest-resolution imaging techniques available is transmission electron microscopy (TEM). A TEM image is created by transmission of high energy (about 60–350 keV) electrons through a very thin sample (a few atomic layers thick). The minimum feature size that can be imaged using a microscopy technique is generally somewhat larger than the wavelength of radiation used, because of diffraction and interference effects. The high electron energies used in TEM correspond to low electron wavelengths, as low as about 0.04 angstroms. The resulting feature sizes resolvable may be as small as one or two angstroms, making TEM a very "high-resolution" technique. There is a price to be paid for this high resolution, however. The thin samples required must be prepared by exacting ion milling techniques which may take several hours.

Scanning electron microscopy (SEM) is another electron-based imaging technique which typically requires minimal sample preparation and can be performed much more rapidly than TEM imaging. An SEM operates by creating a beam of electrons which are accelerated to energies ranging from several hundred to several thousand electron volts. The electron beam is focused to a small diameter and repeatedly scanned across a region of interest of a sample. As the beam strikes the sample's surface, lower-energy secondary electrons are emitted. The yield of secondary electrons depends on many factors, such as the work function of the material, the topography of the sample, and the curvature of the surface. Because different materials may have significantly different work functions, the yield of secondary electrons may be used as a contrast mechanism to distinguish between different materials on a surface. Because changes in topography affect secondary electron yield, one may similarly measure a change in height along the sample's surface. Electron current resulting from the surface-emitted secondary electrons is detected and used to correspondingly control the intensity of pixels on a monitor attached to the SEM. An image of the region being studied is formed by synchronously scanning the electron beam and the screen of the monitor.

The lower-energy electrons used in SEM make it a lower-resolution technique than TEM. Feature sizes on the order of ten angstroms may be resolved by SEM, however, giving the technique a resolution adequate for many aspects of semiconductor device examination. A more significant shortcoming of SEM as compared to TEM may be that interfaces between materials can be more difficult to detect. This is particularly true in the case of interfaces between materials with some similarity in composition, such as silicon/silicide interfaces.

Another difficulty with SEM observations, as well as with other forms of microscopy, is that the area of interest for examination may be buried beneath another portion of the sample. For example, it may be desirable to examine the gate dielectric of a transistor that has failed electrical testing, to look for pinholes or thickness nonuniformities in the dielectric. This might best be accomplished by scanning the electron beam in an SEM over the upper surface of the dielectric. Unfortunately, the dielectric upper surface is not accessible, since it is covered by the gate during fabrication of the transistor.

One approach to the problem of accessing buried layers for examination is known as "deprocessing" or "delayering", in which layers of an integrated circuit are removed so that buried layers may be exposed. This layer removal is typically accomplished using either dry etching or wet etching. There are some problems associated with the delayering approach, however. For example, the etch processes typically used may not have sufficient selectivity to avoid etching of very thin layers, such as gate dielectrics which may have thickness of less than 50 angstroms. Furthermore, the wet and dry etch processes remove all exposed portions of the layer to be etched. If delayering is desired only for a particular transistor or portion of a circuit, formation of a mask layer is needed to protect other portions of the circuit. The photolithography and etching processes typically used to form such a mask layer are time-consuming, add complexity to the failure analysis process, and increase the potential for contamination or defect generation. Another problem with the delayering approach is that air exposure of the sample is often required in the interval between the delayering and characterization of the exposed layer. This air exposure may result in oxidation and/or contamination of the sample, which may alter the layer before it can be characterized.

It would therefore be desirable to enhance the observability of layers such as dielectrics and silicides using SEM or other examination techniques, and to improve detection of interfaces between such layers and adjacent materials. It would further be desirable to develop a method for uncovering surfaces of buried layers for examination. The desired method for uncovering buried layers should avoid problems associated with air exposure in the interval between uncovering and characterization of a buried layer.

SUMMARY OF THE INVENTION

The problems outlined above are addressed by a method in which silicon may be selectively removed from a semiconductor device structure, while other materials, such as dielectrics, metals, and silicides are retained. In addition to this material selectivity, the method is also position-selective, so that the silicon is removed only in desired areas. A silicon-containing sample is loaded into a vacuum chamber having electron beam generation and positioning capability. The chamber is pumped down to a pressure in the $10^{-7}$ millibar range. The sample may be imaged using the electron beam, and the electron beam may be positioned at a desired location, before placement of a shutter preventing the beam from impinging upon the sample. Xenon difluoride ($XeF_2$) gas is introduced into the chamber in the vicinity of the sample, typically using a flow rate such that the chamber pressure increases to the $10^{-5}$ millibar range. At this flow rate, no etching of the sample results from the $XeF_2$ exposure. When the electron beam is unshuttered and allowed to impinge upon the sample in the presence of the $XeF_2$ flow, however, silicon surfaces contacted by the electron beam are selectively etched.

This etching may be material-selective, in that silicon is etched, while other materials, including dielectrics, metals and silicides, are not. Furthermore, the etching may be position-selective, in that etching occurs only for silicon in contact with the electron beam. This combination of material-selective and position-selective etching may allow, for example, very precise examination of selected individual transistors within an integrated circuit. The electron beam controlled etching is also believed to be substantially anisotropic, with etching occurring largely in the direction of the beam.

For the purposes of this disclosure, "silicon" represents a semiconducting material comprised predominantly of silicon atoms. The silicon may be monocrystalline, polycrystalline, or amorphous. Although the silicon may be doped with impurity atoms, materials having concentrations of other atoms which are approximately equal to or greater than the concentration of silicon atoms are not considered to be "silicon". Such materials not considered to be silicon include, for example, silicon oxides and metal suicides. These materials having large concentrations of other atoms are often non-semiconducting materials.

Use of much higher $XeF_2$ pressures, on the order of a few millibar, is known to allow material-selective etching of silicon over dielectrics and metals, with no electron beam applied. This higher-pressure $XeF_2$ etching method is often used in the fabrication of micro-electro-mechanical systems (MEMS) devices. Use of the higher $XeF_2$ pressures may not allow position-selective etching, however. Because silicon etching takes place without application of an electron beam, etching may occur over the entire exposed silicon area of the device, rather than at the position in contact with an electron beam. The etching is also very isotropic in this case, so that control over sidewall profiles and aspect ratios may be difficult. Furthermore, the rate of etch and amount etched are believed to be more difficult to control using such a higher-pressure $XeF_2$ etch, because the pressure of the $XeF_2$ is believed to be difficult to control precisely. This control difficulty may arise because $XeF_2$ is a solid at room temperature and pressure, subliming into a gas at pressures below about 4 torr, or about 5.3 torr. In the lower-pressure electron-beam controlled method recited herein, however, the precise pressure of $XeF_2$ may be less important, because the etch rate is believed to be largely controlled by the electron beam energy and current. In addition, use of higher $XeF_2$ pressures may lead to increased safety risks, because $XeF_2$ is known to react with moisture to produce hydrofluoric acid, which is toxic and necessitates careful safety precautions.

Low pressures of $XeF_2$ in combination with an ion beam have been used to obtain position-selective silicon etching. However, use of this ion beam-enhanced technique has been found to remove some of the material selectivity of the $XeF_2$ etch. For example, low pressures of $XeF_2$ ($10^{-5}$ millibar range) may be used in conjunction with an ion beam to etch silicon dioxide ("oxide") selectively over metals. This is in contrast to the method recited herein in which an electron beam is used and oxide is not believed to be etched. Ion beam enhanced $XeF_2$ etching has also been found to etch cobalt silicide, while the electron beam enhanced method does not.

In embodiments of the method recited herein for which the sample has exposed silicon surfaces, electron-beam controlled XeF$_2$ etching may be used to remove the silicon in selected areas such that underlying portions of the sample are exposed. This embodiment may allow, for example, an upper surface of a gate dielectric to be exposed by removal of an overlying polysilicon gate. In this way, the gate dielectric surface could be examined for the presence of pinholes or other morphological defects.

In embodiments for which silicon portions of the sample are buried below or behind other materials, a position-selective removal of a portion of the overlying materials may be combined with the electron-beam controlled silicon etch. For example, an opening may be formed through a transistor gate structure including a silicide layer over a polysilicon layer over a gate dielectric over monocrystalline silicon. The opening is preferably formed using a position-selective method such as ion milling or ion-beam controlled etching. In addition to the silicide layer at the top of this gate structure, the underlying silicon and dielectric layers are exposed in cross-section in the sidewalls of the opening. Electron-beam controlled silicon etching may then be employed to etch the silicon layers back from the sidewalls of the opening. In this way, upper and/or lower edges of the silicide and the gate dielectric are exposed by removal of the adjacent silicon. This may allow ready detection of the upper and lower edges of the silicide and gate dielectric, and thereby provide enhanced ability to measure the corresponding layer thickness and examine the interface profiles using SEM.

In addition to selectively etching silicon over other materials, the electron beam enhanced XeF$_2$ etch recited herein also shows selectivity between different forms of silicon. For example, polysilicon may be etched much more rapidly than monocrystalline silicon in some embodiments of the method. This may be useful for embodiments in which it is desirable to remove polysilicon while leaving nearby monocrystalline silicon largely intact. As an example, a polysilicon gate conductor could be removed, exposing the underlying gate dielectric, while leaving the monocrystalline silicon substrate beneath the gate dielectric intact. Retention of the substrate may provide mechanical stability allowing the sample to be characterized by alternate methods. For example, atomic force microscopy (AFM), in which a probe held close to a surface is scanned with angstrom-level resolution, may be used to detect small steps on the surface of the sample which may indicate the locations of thin layers such as gate dielectric layers.

In embodiments for which SEM is used to image the sample after the electron-beam-controlled silicon etching described above, the method recited herein provides the possibility of performing the etching and imaging in the same chamber. Imaging is typically performed during the etch process, and may be performed before and/or after etching. Imaging and etching in the same chamber may be advantageous for samples which may be oxidized or contaminated by exposure to the ambient outside the vacuum chamber. Alternatively, the sample may be removed from the vacuum chamber after selective silicon etching in some embodiments, for imaging or other examination at a different location. In some embodiments, removal of silicon in the vicinity of a layer to be examined may make the sample more stable against changes (such as oxidation) upon transfer out of the vacuum chamber.

In addition to the applications described above, the position-selective and material-selective etching of silicon described herein may be applied to manufacturing of silicon-containing devices. Examples may include selective trimming of silicon structures such as gate conductors, or selective removal of silicon for other applications in the manufacture of electronic devices or MEMS devices.

In addition to the method described above, an examination structure for semiconductor manufacturing and failure analysis is contemplated herein. A device structure including a silicon layer and a layer formed from a different material is configured upon a semiconductor substrate. The different material may include a dielectric, a metal and/or a metal silicide. An opening formed in the silicon layer exposes a portion of an upper or lower surface of the different material layer. In one embodiment of the examination structure, an upper surface of a gate dielectric layer is exposed by an opening in an overlying polysilicon layer. The morphology of the exposed upper surface of the gate dielectric may be examined by various techniques, such as SEM and AFM. In an alternative embodiment, openings are formed both in a silicon layer overlying a gate dielectric and a silicon layer underlying the gate dielectric. In this way, a portion of the gate dielectric is an isolated thin membrane which may be examined by electron microscopy or other techniques. Information which may be available from such an examination includes, for example, dielectric thickness, dielectric thickness uniformity, and quality of the dielectric surface morphology.

In another embodiment of the examination structure, an opening formed in the silicon layer exposes a portion of the lower surface of an overlying silicide layer. The exposed surface of the silicide facilitates measurement of the silicide thickness using SEM or other microscopy techniques. The profile of the silicide lower surface may also provide information as to the profile of the interface between the silicide and the original underlying silicon. Measurement of the thickness of a silicide or dielectric layer by SEM is facilitated using examination structures such as those described above. Fabrication and SEM examination of such structures is believed to allow a thickness measurement to be obtained in about one hour or less. By contrast, obtaining such a thickness measurement using TEM may take significantly longer.

BRIEF DESCRIPTION OF THE DRAWINGS

Other objects and advantages of the invention will become apparent upon reading the following detailed description and upon reference to the accompanying drawings in which.

Figure 1:
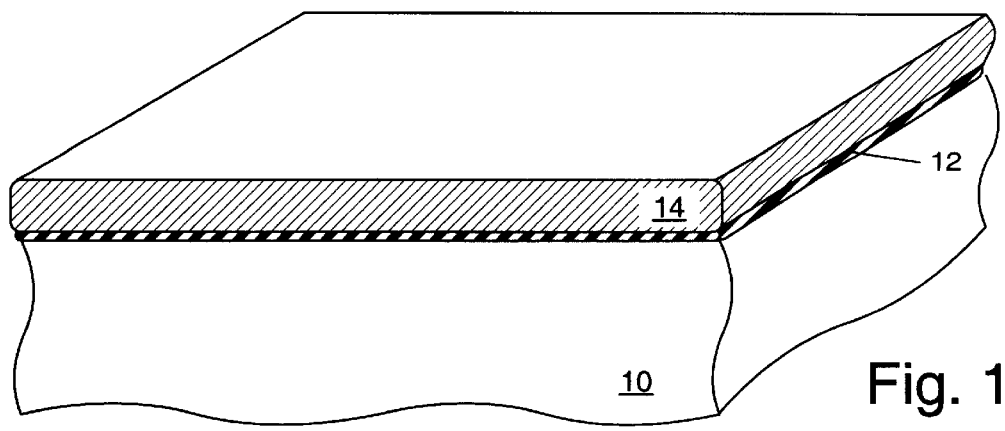
FIG. 1 is a perspective view of a semiconductor topography corresponding to an example of the method recited herein, including a polysilicon layer and a dielectric layer formed upon a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, FIG. 1 is a perspective view of an exemplary semiconductor topography including semiconductor substrate 10, dielectric 12, and polysilicon layer 14. Semiconductor substrate 10 is preferably monocrystalline silicon. In embodiments for which a transistor is formed, substrate 10 may be doped either n-type or p-type. Substrate 10 may be, for example, an epitaxial silicon layer grown on a monocrystalline silicon substrate, or an epitaxial silicon layer grown over an insulating layer on a semiconductor substrate. When substrate 10 is formed from silicon, dielectric 12 may be grown by heating substrate 10 to a temperature of greater than about 700° C. in an oxidizing ambient to grow silicon dioxide, a nitrogen-containing ambient to grow silicon nitride, or an ambient containing both oxygen and nitrogen to form an oxynitride or nitrided oxide. Other dielectrics may also be used, including deposited silicon dioxide and silicon nitride, as well as nitrided silicon dioxide and silicon oxynitride. Polysilicon layer 14 may be deposited using chemical vapor deposition (CVD) of silicon from, for example, a silane source. The semiconductor topography of FIG. 1 may represent a portion of a wafer removed from a fabrication process, at a point just before patterning of layers 12 and 14 to form a gate dielectric and gate conductor.

Figure 2:
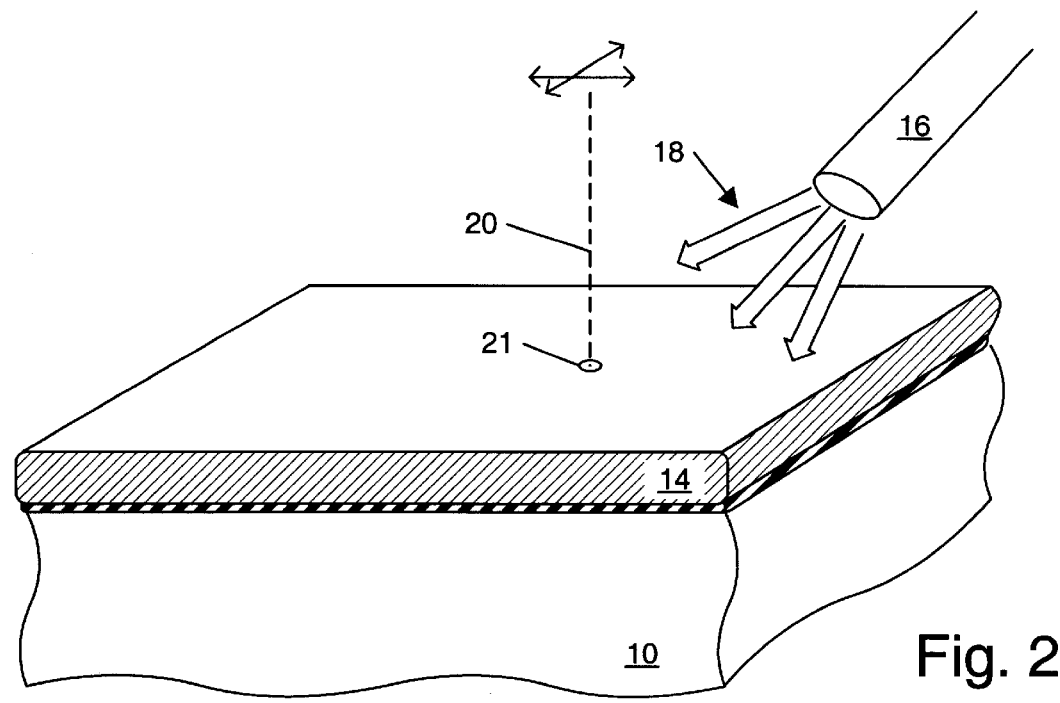
FIG. 2 is a perspective view of the semiconductor topography of FIG. 1, wherein the polysilicon surface is exposed to and etched by xenon difluoride gas and an electron beam.

The semiconductor topography of FIG. 1 is positioned within a vacuum chamber. Gas injector 16 is used to direct $XeF_2$ gas 18 to the upper surface of polysilicon layer 14, as shown in FIG. 2. Gas injector 16 may take the form of a tube connected to a gas feedthrough in the wall of the vacuum chamber, such that a gas introduced into the vacuum chamber using the gas feedthrough is directed through gas injector 16. Gas injector 16 extends from the chamber wall to the vicinity of the semiconductor topography, such that the upper surface of the topography (in this case, the upper surface of layer 14) is exposed to $XeF_2$ gas 18. In the embodiment of FIG. 2, the upper surface of layer 14 is also exposed to electron beam 20. Upon exposure to electron beam 20 in the presence of $XeF_2$ gas 18, position-selective etching of polysilicon layer 14 begins. Depression 21 is formed in the upper surface of layer 14 at the position of electron beam 20, as material is etched away.

In one embodiment of the method recited herein, the vacuum chamber used is associated with a model DualBeam 820 focused ion beam milling system and electron microscope manufactured by FEI Company of Hillsboro, Oregon. The pressure of this vacuum chamber before introduction of $XeF_2$ gas 18 into the vacuum chamber is approximately $5 \times 10^{-7}$ millibar, and the pressure after introduction of the $XeF_2$ gas is approximately $5 \times 10^{-5}$ millibar. A $XeF_2$ source compatible with the DualBeam 820 is currently supplied by FEI Company. $XeF_2$ gas sources are also available from, for example, Surface Technology Systems Limited, of Imperial Park, Newport, United Kingdom. As noted above, much higher $XeF_2$ gas pressures result in isotropic etching of silicon without the presence of an electron beam. The precise upper limit in $XeF_2$ gas pressure at which position-selective etch control by the electron beam is lost is not known, but it is believed that position-selective etching occurs over the range of pressures which allow electron beam operation.

The ion beam in the DualBeam 820, a beam of gallium ions accelerated to 30 keV, is typically used to remove portions of a semiconductor topography. This removal may be considered a type of ion milling process, having high positional selectivity but little material selectivity. During conventional operation of a dual beam system such as the DualBeam 820, gases such as $XeF_2$ may be used in conjunction with the ion beam to improve etch rate and/or material selectivity. As noted above, $XeF_2$ gas provides selectivity of the ion beam etch process to metal when etching oxide, for example, and iodine gas provides selectivity to oxide when etching metal. The electron beam of the DualBeam 820 is a scanning electron beam produced by an electron column. Such electron columns are also used in scanning electron microscopes, and the electron beam in the DualBeam 820 and similar focused ion beam (FIB) workstations is used for imaging of a sample before, during and/or after milling using the ion beam.

In embodiments of the method recited herein, the DualBeam 820 workstation is operated in a non-conventional way, in that the electron beam is used for etching as well as imaging. A beam voltage of 10 kV is typically used for electron beam 20 of FIG. 2. A beam spot size setting of "3" (out of 4, with "1" corresponding to the smallest spot size, and "4" the largest) on the DualBeam 820 is typically used. In part because the spot size typically depends on the beam voltage, correspondence between these spot size settings and actual spot size dimensions may be variable. As a guideline, the diameter of the spot formed by the electron beam of the DualBeam 820 using an electron energy of 10 keV and the spot size "3" setting is specified to be approximately 17 angstroms. The electron column magnification setting used is typically 8000×.

Figure 3:
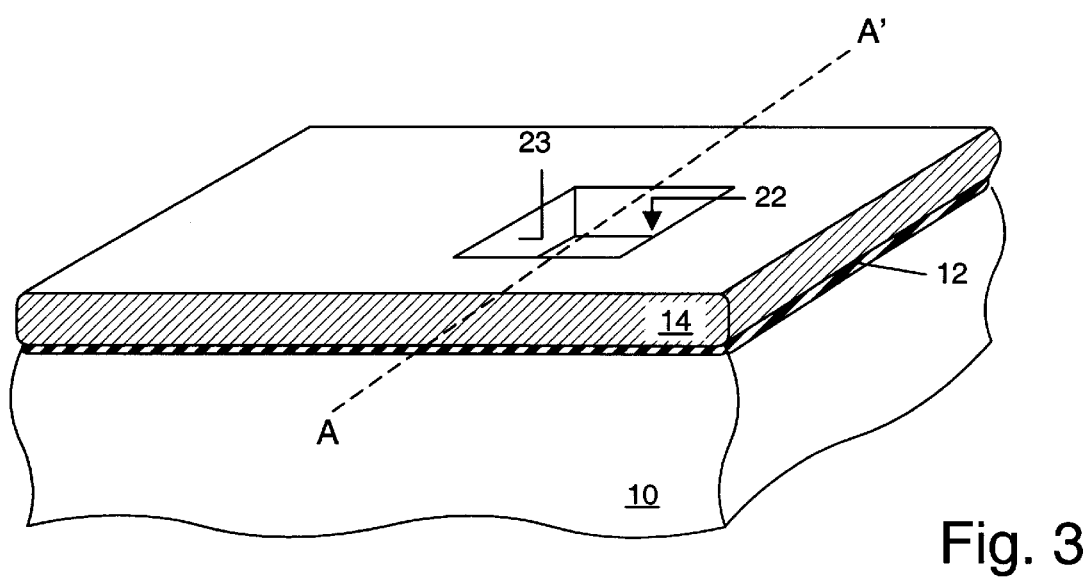
FIG. 3 is a perspective view of the semiconductor topography showing an opening etched into the polysilicon layer, as a result of the gas and electron beam exposure and etch of FIG. 2.
Figure 4:
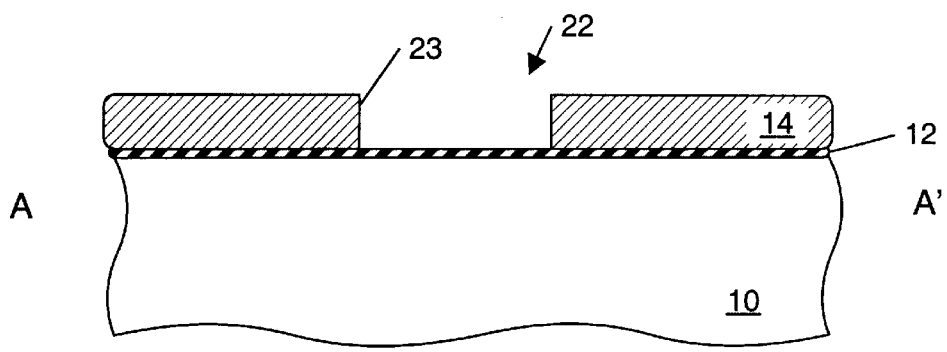
FIG. 4 is a cross-sectional view of the topography of FIG. 3 along cut A–A'.

Repeated scanning of electron beam 20, as indicated by arrows in FIG. 2, in the presence of $XeF_2$ gas 18 allows formation of a recess 22 within polysilicon layer 14, as shown in FIG. 3. The scanning is preferably performed using a scanning electron column and associated controls, such as those used in scanning electron microscopes or dualbeam FIB workstations as discussed above. The upper surface of dielectric 12 forms the bottom of recess 22, as may be seen more clearly in the cross-sectional view of FIG. 4. A cross-sectional view of a cut along dashed line A–A' of FIG. 3 is shown in FIG. 4. The selectivity of the electron beam controlled etch is illustrated by the removal of polysilicon layer 14 in the region scanned by electron beam 20, while dielectric 12 remains intact. It should be noted that thin dielectrics such as dielectric 12 exposed by the method recited herein are believed to be best observed by SEM when low electron beam energies of about 1 kV are used for imaging. This usefulness of low imaging energies for observation of thin dielectrics is believed to be related to penetration depth and/or charging effects of the imaging electrons.

Altering the beam conditions is believed to affect both the etch rate and the material selectivity of the etch to some degree. In general, conditions which produce a more frequent or more concentrated irradiation from the electron beam produce a higher etch rate, and may result in reduced material selectivity. As an example of typical etch rates, a polysilicon gate conductor having a thickness of approximately 4000 angstroms and an area of approximately 0.25 micron×2 microns may be removed in about 20 seconds using the typical beam conditions described above for the DualBeam 820. Increasing the magnification of the electron beam column to 80,000× has been observed to increase the silicon etch rate as compared to that obtained using the 8000× magnification, but is also believed to result in removal of a thin gate oxide underlying the original polysilicon layer of the structure. Similarly, increases in electron beam energy and/or decreases in beam spot size may increase etch rate while reducing selectivity. In embodiments for which electron beam 20 is supplied by an SEM electron column, the size of the scanned area is determined by the magnification, with larger magnifications producing smaller scanned areas. In the case of the DualBeam 820, for example, the area scanned by the electron beam (i.e., the field of view), thereby the area over which etching occurs in the presence of the XeF$_2$ gas, may typically have dimensions on the order of ten microns on a side.

In addition to affecting the etch rate and material selectivity, the electron beam conditions described above are also believed to affect the degree of anisotropy which may be obtained, as well as the smoothness of the etched surfaces. Roughness of etched surfaces of on the order of 0.2 microns has been observed using the method described herein for some beam conditions. Some undercut, or etching of material underlying unetched dielectric layers, has also been observed. Scattering within the sample of the electron beam is believed to reduce the anisotropy of the etch and contribute to roughness of etched surfaces. It is believed that reduced electron beam energies may result in less electron scattering within the sample, thereby allowing improved anisotropy and reduced surface roughness. Reduction of other beam parameters, such as dwell time of the beam, may have a similar effect.

The removal of a portion of polysilicon layer 14 over dielectric 12, shown in FIGS. 3 and 4, may allow accurate characterization of the surface of dielectric 12 by SEM. When dielectric 12 is initially formed on substrate 10, it may be subject to thickness changes from oxidation of substrate 10 during subsequent air exposure. In the case of thin dielectrics (approximately 50 angstroms or less) and particularly oxides, oxygen in the air may diffuse through the dielectric and cause oxidation at the interface between the dielectric and the substrate. Such oxidation may occur in a time interval between formation of dielectric 12 and its characterization, such that the dielectric which is characterized does not have the same thickness as that originally deposited. The upper surface of dielectric 12 may also be exposed to surface contaminants between formation and characterization, if characterization is done following deposition of dielectric 12 and before deposition of other layers. Covering dielectric 12 with another layer, such as polysilicon layer 14, prevents additional oxidation. Removing a portion of overlying layer 14 in a vacuum chamber by the electron-beam controlled method described herein exposes the upper surface of dielectric 12, but does so in a vacuum environment in which oxidation and surface contamination are greatly reduced. In this way, dielectric 12 may be imaged by SEM while avoiding changes to the dielectric caused by, for example, oxidation or contamination.

Figure 5:
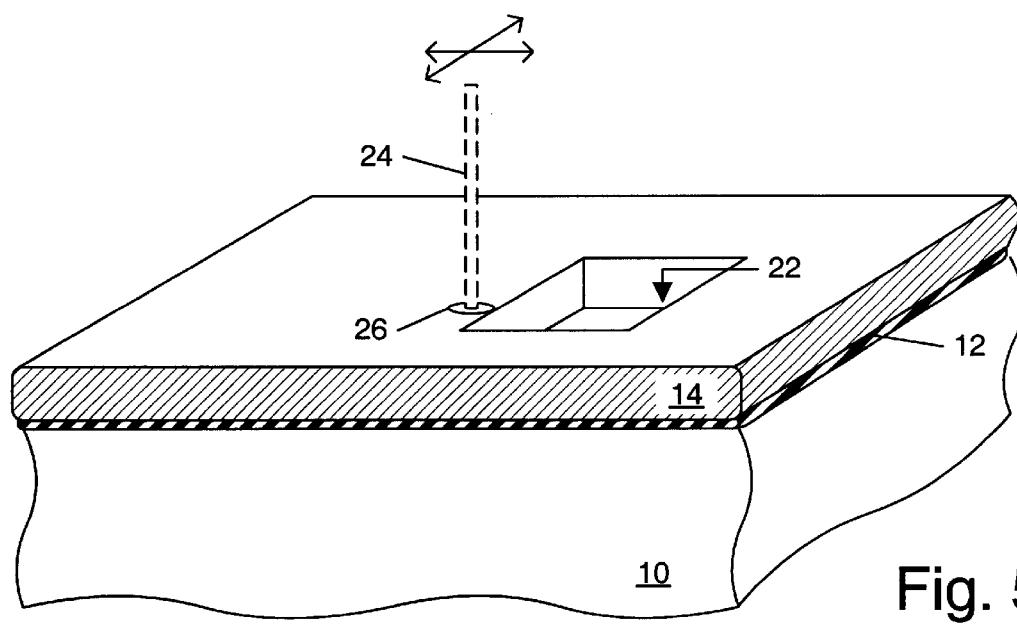
FIG. 5 is a perspective view of the semiconductor topography, wherein an ion beam is incident upon the upper surface of the topography, subsequent to the etching of FIG. 2.
Figure 6:
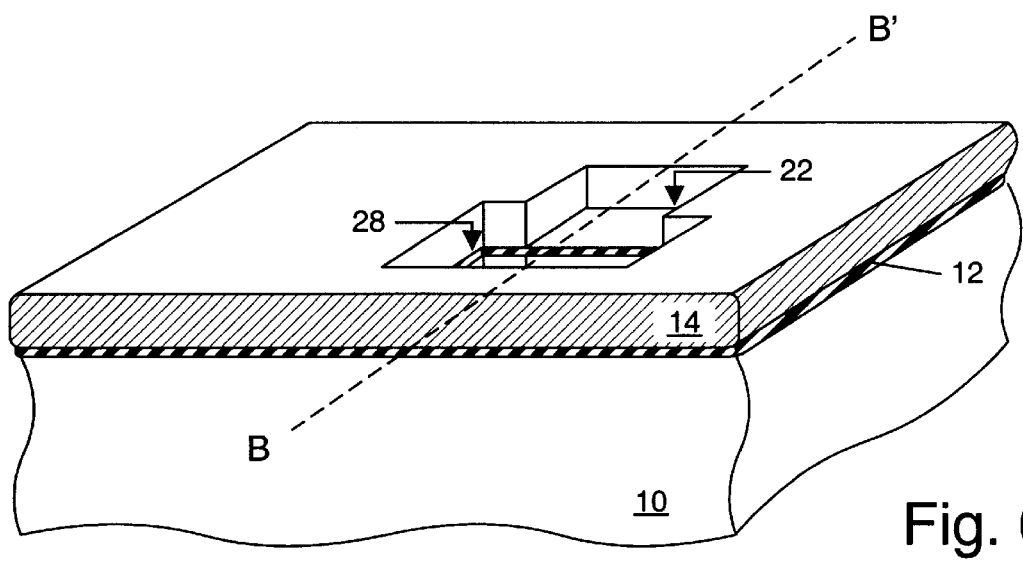
FIG. 6 is a perspective view of the semiconductor topography showing a second opening milled into the upper surface of the topography, as a result of the ion beam exposure of FIG. 5.

In some embodiments of the method recited herein, it may be desirable to isolate a particular non-silicon layer of a semiconductor topography by removing silicon both above and below the layer. In this case, it may be necessary to remove a portion of the topography such that the non-silicon layer to be isolated is exposed in cross-section. An example of such a removal is shown in FIGS. 5 and 6. In FIG. 5, the semiconductor topography of FIG. 4 is exposed to ion beam 24. Depression 26 is formed in the semiconductor topography at the location where ion beam 24 contacts the topography. This use of an ion beam to remove material in a position-selective manner may correspond to an ion milling process. In the embodiment of FIG. 5, no gas exposure is shown. A gas may also be used however, and exposure using a gas such as XeF$_2$ may result in an increased material removal rate. In one embodiment ion beam 24 is a beam of gallium ions accelerated to 30 keV. The etch rate is dependent on the ion beam current. For rapid removal, a beam current of approximately 1000 picoamperes may be used. For a slower removal with more accurate dimensional control, a lower current of, for example, about 70 picoamperes may be used. Material removal using ion beam 24 is much less material selective than the electron beam controlled etching of FIG. 2, so that exposed portions of dielectric 12 may be removed.

Scanning of ion beam 24, as indicated by the arrows in FIG. 5, is used to form a recess 28 overlapping recess 22. Recess 28 is deeper than recess 22, extending through dielectric 12, such that sidewalls of recess 28 contain a cross-sectional portion of dielectric 12. In one embodiment, imaging of the topography using an electron beam such as beam 20 of FIG. 2 is performed during formation of recess 28. In this way, silicon substrate 10 may be observed at the bottom of recess 28 when ion beam 24 has "cut through" dielectric 12. This observation of silicon substrate 10 may be used to indicate when material removal with ion beam 24 may be ended.

Figure 7:
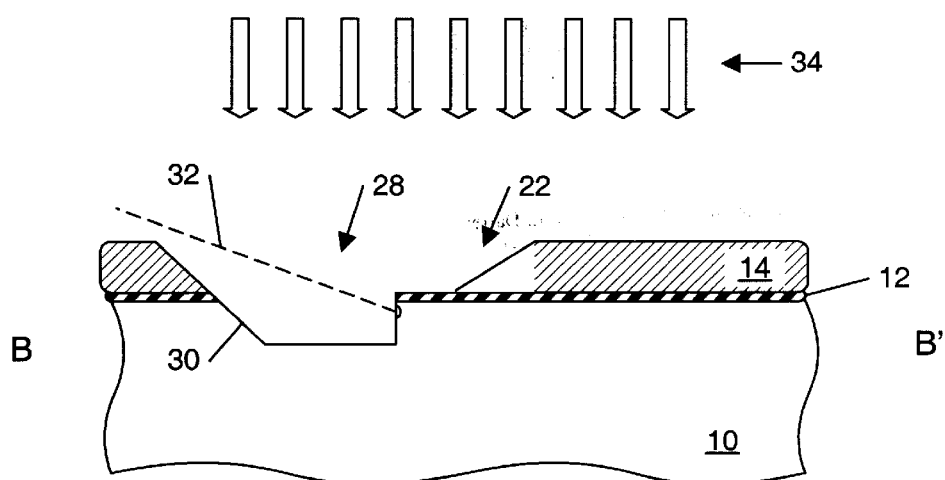
FIG. 7 is a cross-sectional view of the topography of FIG. 6 along cut B–B', showing exposure of the topography to xenon difluoride gas and an electron beam, subsequent to the ion milling of FIG. 5.

A cross-sectional view along cut B–B' of FIG. 6 is shown in FIG. 7. In the embodiment of FIG. 7, recess 28 has an angled sidewall 30. Such an angled sidewall may be fabricated by tilting ion beam 24 with respect to the normal of the upper surface of polysilicon layer 14. This tilting is preferably accomplished using a sample holder having precision translation and rotation capability, such that the position of substrate 10 may be controlled. The tilt of sidewall 30 in FIG. 7 may allow improved access to the portion of substrate 10 underlying dielectric 12. This portion of substrate 10 may be etched using electron beam 32 in the presence of XeF$_2$ gas 34, as shown in FIG. 7. Electron beam 32 is similar to electron beam 20 of FIG. 2, and XeF$_2$ gas 34 is similar to XeF$_2$ gas 18 of FIG. 2. Although not shown in FIG. 7, XeF$_2$ gas 34 is preferably introduced using a gas injector in a similar manner as for XeF$_2$ gas 18 in FIG. 2. In the embodiment of FIG. 7, electron beam 32 is tilted with respect to the normal of the upper surface of polysilicon layer 14, in order to allow beam 32 to reach the portion of substrate 10 underlying dielectric 12. As described above in reference to tilting of ion beam 24, tilting of electron beam 32 may be accomplished by changing the angle of substrate 10 using a precision sample manipulator. Electron beam 32 is scanned in a manner similar to electron beam 20 of FIG. 2. In embodiments for which electron beams 20 and/or 32 are produced using an SEM electron column, the area of the sample scanned generally corresponds to the field of view of the microscope. The scanned area may be changed by changing the magnification of the microscope.

Figure 8:
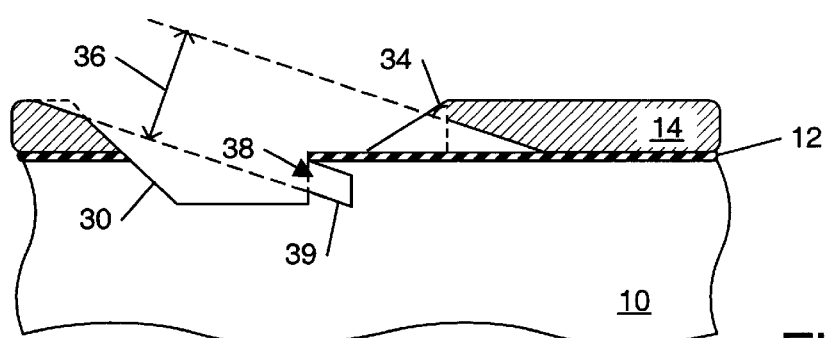
FIG. 8 is a cross-sectional view of the topography showing recesses in the silicon substrate and polysilicon layer, as a result of the gas and electron beam exposure of FIG. 7.

A cross-sectional view of the topography of FIG. 7 after electron beam controlled etching is shown in FIG. 8. In the embodiment of FIG. 8, a single angle 34 between electron beam 32 and the surface normal is used. The width 36, in the plane normal to the electron beam direction, of the area scanned by the beam subtends the portions of the topography in which silicon layers are etched by electron beam 32. In embodiments for which an SEM column is used to produce electron beam 32, width 36 corresponds to the width of the field of view of the scanning electron microscope. Surfaces of the semiconductor topography before etching using electron beam 32 and XeF$_2$ gas 34 are shown using short-dashed lines. Recess 38 in silicon substrate 10 underlying dielectric 12 is formed by the electron beam controlled etch. Formation of recess 38 isolates a portion of dielectric 12 from the silicon originally above and below it. This isolation may allow more accurate determination of, for example, the thickness and/or thickness uniformity of dielectric 12 by SEM. Furthermore, removal of the silicon adjacent to a portion of dielectric 12 may provide stability for this portion against oxidation when the sample is exposed to air. This stability against oxidation may allow removal of the sample to another chamber for examination, without allowing a change in dielectric thickness such as would result from oxidation. As shown in FIG. 8, sidewalls of recess 38, such as sidewall 39, are straight and angled in the direction of incidence of the electron beam. Different etch profiles in polysilicon layer 14 and silicon substrate 10 could be formed by, for example, using more than one angle of incidence of electron beam 32.

Figure 9:
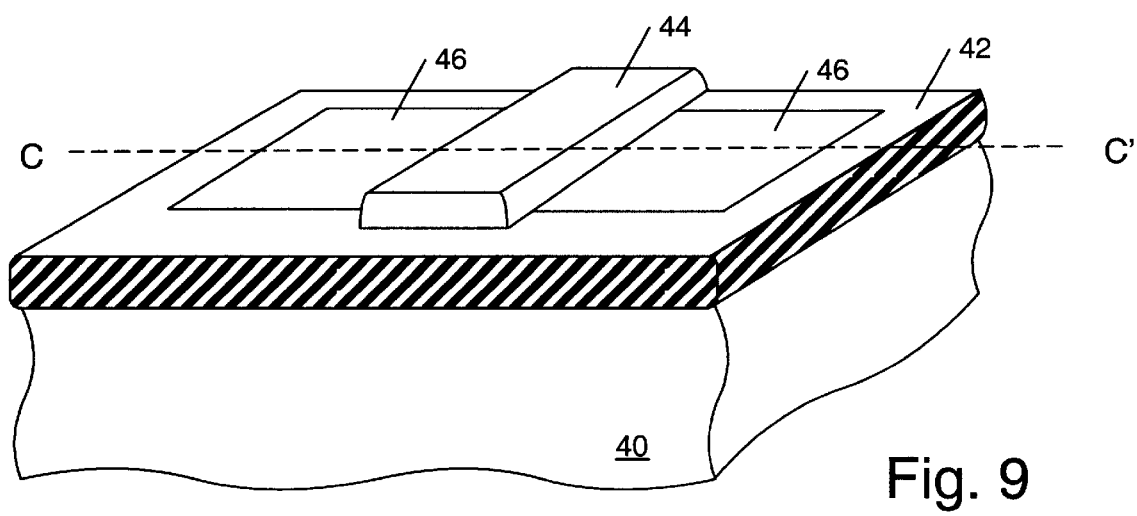
FIG. 9 is a perspective view of a semiconductor topography corresponding to another example of the method recited herein, including upper surfaces of the gate, drain and source regions of a MOSFET.
Figure 10:
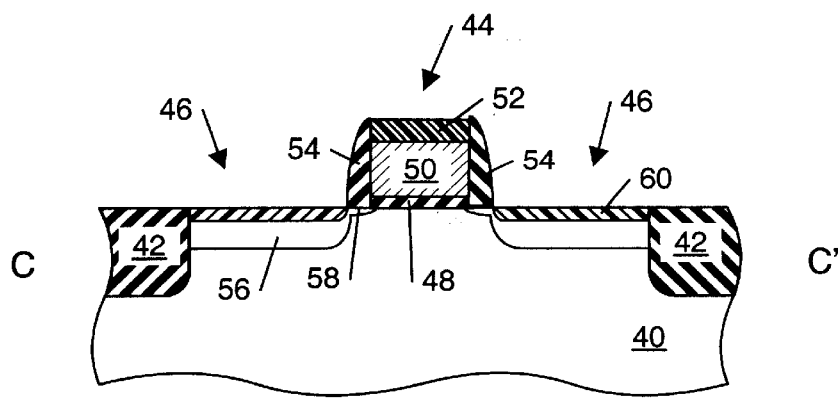
FIG. 10 is a cross-sectional view along cut C–C' of the MOSFET of FIG. 9.

Turning now to FIG. 9, a perspective view of a semiconductor topography corresponding to another example of the method is shown. Dielectric isolation region 42 is formed within semiconductor substrate 40, which is similar to substrate 10 of FIG. 1 (preferably a monocrystalline silicon substrate). Isolation region 42 surrounds a transistor which includes gate structure 44 and source/drain regions 46. A cross-sectional view along cut C–C' of FIG. 9 is shown in FIG. 10. It can be seen in the cross-section of FIG. 10 that gate structure 44 includes gate dielectric 48, polysilicon gate conductor 50, gate silicide 52 and dielectric spacers 54. Source/drain regions 46 include deep source/drain portions 56, shallow source/drain portions 58, and source/drain silicides 60. The semiconductor topography of FIG. 10 may represent a portion of an integrated circuit fabricated up to just before the point of forming contacts and interconnects.

Figure 11:
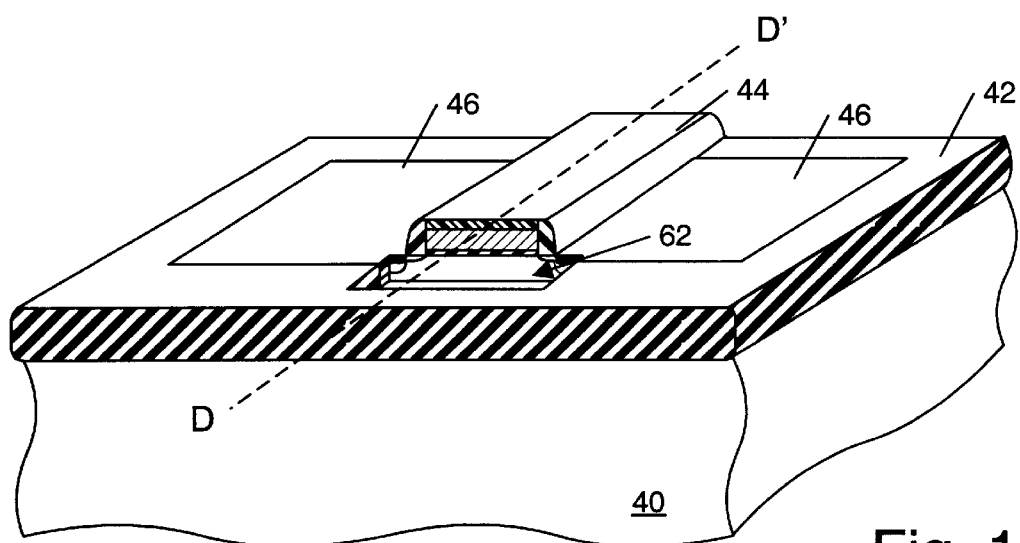
FIG. 11 is a perspective view of the semiconductor topography of FIG. 9, wherein a recess has been formed within the topography.
Figure 12:
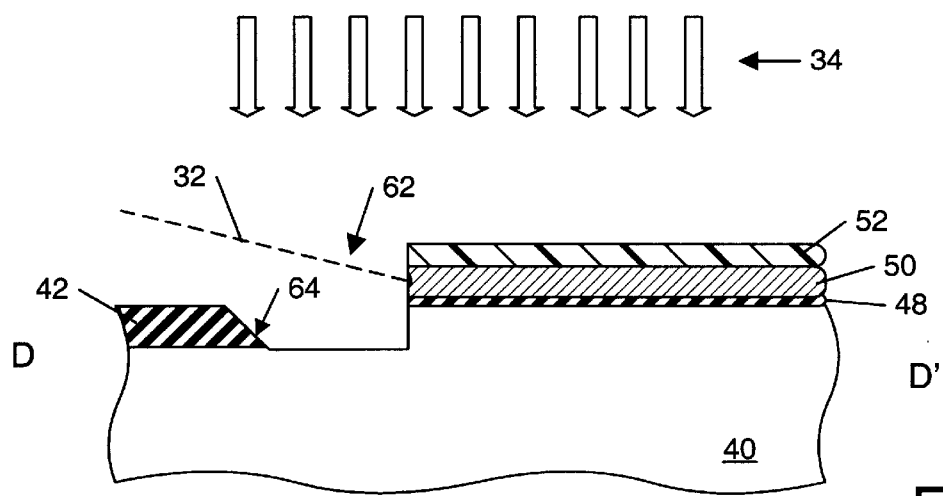
FIG. 12 is a cross-sectional view along cut D–D' of FIG. 11, wherein the topography is exposed to xenon difluoride gas and an electron beam.

A portion of the semiconductor topography, including the end of gate conductor 44, is removed, as shown in FIG. 11. This removal may be accomplished using an ion beam, such as beam 24 in FIG. 5. The removal exposes gate structure 44 and portions of source/drain regions 46 in cross-section within a sidewall of recess 62. A cross-sectional view along cut D–D' of FIG. 11 is shown in FIG. 12. It can be seen from the cross-section of FIG. 12 that recess 62 has an angled sidewall 64. Sidewall 64 may be formed in a similar manner to angled sidewall 30 of FIG. 7. In a manner also similar to that of FIG. 7, the semiconductor topography of FIG. 12 is exposed to electron beam 32 and XeF$_2$ gas 34. Repeated scanning of beam 32 over a region of the topography allows material-selective etching of silicon which is exposed to electron beam 32 in the presence of XeF$_2$ gas 34. Polysilicon layer 50 is believed to be etched more rapidly than substrate 40, if substrate 40 is a monocrystalline silicon substrate. A relatively short etch time may therefore result in the topography of FIG. 13, in which portions of polysilicon layer 50 are removed to form recess 66, while substrate 40 remains intact. The etch time needed to remove polysilicon portions while leaving monocrystalline portions intact depends on factors such as the magnification, energy and spot size of electron beam 32. As an example, if a magnification of 8000× and an electron energy of 10 keV are used, an etch time between about 15 seconds and about 20 seconds is believed to produce etching of polysilicon with selectivity to monocrystalline silicon. The removal of a portion of polysilicon layer 50 underlying silicide 52 may be advantageous in allowing more accurate detection of the interface between silicide 52 and polysilicon 50 using, for example, SEM. Such improved interface detection may allow relatively rapid determination of silicide thickness and evaluation of the interface between the silicide and underlying silicon.

Figure 13:
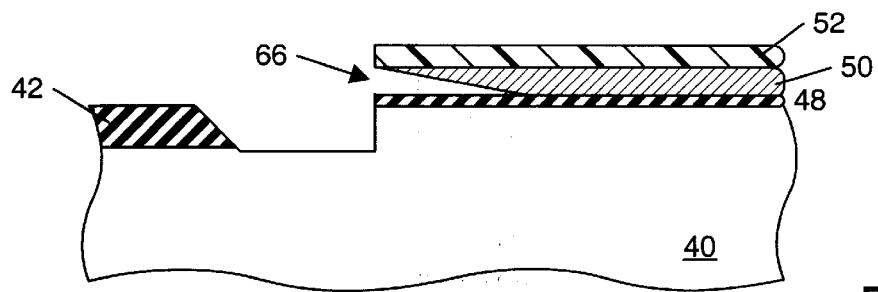
FIG. 13 is a cross-sectional view of the topography showing a recess formed in a polysilicon layer of the topography, as a result of the gas and electron beam exposure of FIG. 12.
Figure 14:
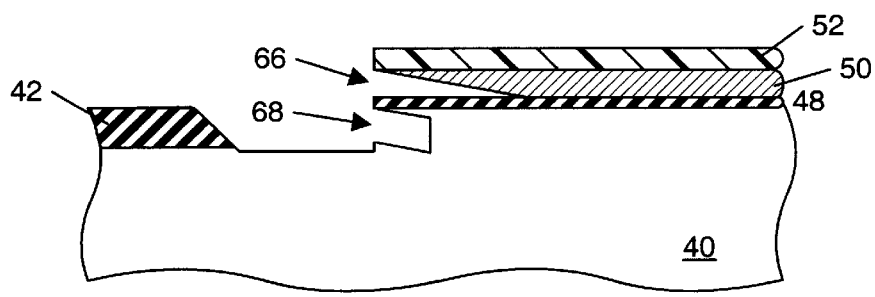
FIG. 14 is a cross-sectional view of the topography showing recesses formed in polysilicon and monocrystalline silicon layers, as a result of the gas and electron beam exposure of FIG. 12.

Use of longer etch times for the etch of FIG. 12, on the other hand, may result in the topography of FIG. 14, in which a portion of substrate 40 is removed to form recess 68, in addition to the formation of recess 66 in polysilicon layer 50. Using a magnification of 8000× and an electron beam energy of 10 keV, a suitable etch time for removal of monocrystalline silicon may be approximately 60 seconds or more. Removal of a portion of substrate 40 underlying gate dielectric 48 may be advantageous in a similar manner as discussed in the description of FIG. 8 above. As in the case of FIG. 8, the electron beam controlled etch of FIGS. 12–14 is performed using a single angle of electron beam 32 with respect to the semiconductor topography. Different etch profiles may be obtained by using more than one angle (for example, by changing the tilt of the topography during the etch period).

Figure 15:
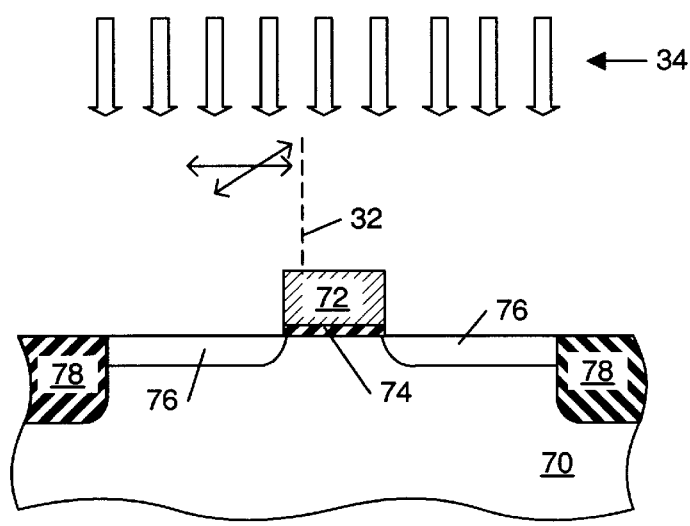
FIG. 15 is a cross-sectional view of a semiconductor topography according to another example of the method recited herein, wherein a polysilicon gate conductor is exposed to xenon difluoride gas and an electron beam.
Figure 16:
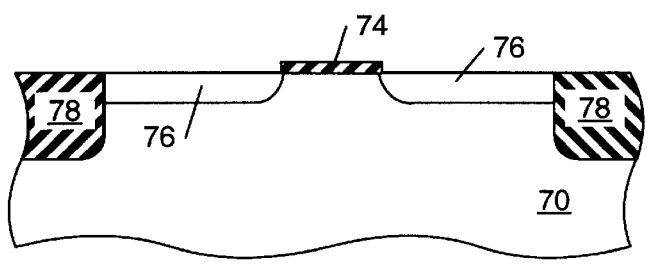
FIG. 16 is a cross-sectional view of the semiconductor topography wherein the gate conductor has been removed, as a result of the gas and electron beam exposure of FIG. 15.

An additional example of the use of the difference in etch rates between polysilicon and single-crystal silicon is shown in FIGS. 15 and 16. The cross-sectional view of FIG. 15 shows polysilicon gate conductor 72 arranged upon gate dielectric 74 over monocrystalline silicon substrate 70. Source/drain regions 76 may be formed within substrate 70 on either side of gate conductor 72, and dielectric isolation regions 78 separate these source/drain regions from those of neighboring transistors in the integrated circuit. The semiconductor topography of FIG. 15 may represent a transistor removed from the processing line after patterning of the gate conductor but before formation of dielectric spacers on sidewalls of the gate conductor. Alternatively, the topography may represent a transistor on which additional processing has been performed, and some portions have been removed during evaluation. For example, if spacers are formed on sidewalls of gate conductor 72, these spacers are subsequently removed (by, for example, ion milling or a selective etch) to arrive at the topography of FIG. 15. As another example, if a silicide is formed on the upper surface of gate conductor 72, this silicide is removed to expose gate conductor 72. If present, source/drain regions 76 may include deep source/drain portions, shallow source/drain portions, and/or source/drain suicides.

Gate conductor 72 is exposed to electron beam 32 and XeF$_2$ gas 34, as shown in FIG. 15. Scanning of electron beam 32 across polysilicon gate conductor 72 results in etching of the gate conductor. The entire gate conductor may be removed in this fashion, as shown in FIG. 16. If the etching time is relatively short, as discussed further in the description of FIG. 13 above, exposed portions of substrate 70 are not etched, even if they are in contact with electron beam 32. Removal of a polysilicon gate conductor while the gate dielectric and substrate remain intact may be advantageous, for example, in applying subsequent characterization techniques which require mechanical stability of a sample. For example, the upper surface of gate dielectric 74 may be subsequently examined using AFM.

It will be appreciated by those skilled in the art having the benefit of this disclosure that this invention is believed to provide a method for position-selective and material-selective removal of silicon from a semiconductor topography, and semiconductor examination structures formed using this method. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. An examination structure for semiconductor manufacturing, comprising a non-semiconductor layer interposed between a first silicon layer and a second silicon layer within a semiconductor topography, wherein portions of substantially horizontal and vertical surfaces of the non-semiconductor layer comprise a wall of a recess within the semiconductor topography, and wherein the recess further comprises an angled sidewall located opposite the wall and positioned at an angle between 0 and 90 degrees relative to an upper surface of the non-semiconductor layer.

2. The structure as recited in claim 1, wherein said first silicon layer comprises monocrystalline silicon.

3. The structure as recited in claim 1, wherein said second silicon layer comprises polycrystalline silicon.

4. The structure as recited in claim 1, wherein said first silicon layer comprises silicon doped with impurity atoms.

5. The structure as recited in claim 1, wherein said non-semiconductor layer comprises a dielectric.

6. The structure as recited in claim 1, wherein said non-semiconductor layer comprises a metal.

7. The structure as recited in claim 6, wherein said non-semiconductor layer comprises a metal silicide.

8. The structure as recited in claim 1, wherein said wall further comprises a portion of an underside surface of the non-semiconductor layer.

9. The structure as recited in claim 1, wherein a portion of said wall is within the first silicon layer and comprises a substantially straight profile.

10. The structure as recited in claim 9, wherein said portion of the wall comprises a substantially vertical profile.

11. The structure as recited in claim 1, wherein said recess is confined to a localized region within the semiconductor topography containing a single transistor.

12. The structure of claim 1, wherein said wall further comprises a portion of an underside surface of the second silicon layer, and wherein the second silicon layer is above the first silicon layer.

13. An examination structure for semiconductor manufacturing, comprising:

a silicon layer adjacent a non-semiconductor layer within a semiconductor topography;

a first recess within the silicon layer, wherein a portion of an upper surface of the non-semiconductor layer comprises a wall of the first recess; and a second recess within a sidewall of said first recess, wherein a portion of a vertical surface perpendicular to the upper surface of the non-semiconductor layer comprises a wall of the second recess.

14. The structure as recited in claim 13, wherein said first recess comprises an angled sidewall located opposite of said wall of the first recess, wherein said angled sidewall has a substantially straight profile, and wherein said angled sidewall is positioned at an angle between 0 and 90 degrees relative to a bottom surface of said first recess.

15. The structure as recited in claim 13, wherein said first recess and said second recess are formed by exposing the semiconductor topography to an electron beam in a xenon difluoride gas ambient.

16. The structure as recited in claim 13, wherein said silicon layer comprises a silicon substrate underlying said non-semiconductor layer, wherein said structure further comprises:

a second silicon layer adjacent and above said non-semiconductor layer;

a silicide layer adjacent and above said second silicon layer; and a third recess within the second silicon layer, wherein a segment of a lower surface of said silicide layer comprises a wall of the third recess.

17. The structure as recited in claim 16, wherein said third recess is spaced above said second recess.

18. An examination structure for semiconductor manufacturing, comprising a non-semiconductor layer interposed between a lower silicon layer and an upper silicon layer within a semiconductor topography, wherein portions of substantially horizontal and vertical surfaces of the lower silicon layer comprise a wall of a recess within the semiconductor topography, and wherein said wall further comprises a portion of an underside surface of the non-semiconductor layer or the upper silicon layer.

19. The examination structure of claim 18, wherein said underside surface comprises a bottom horizontal surface of the non-semiconductor layer.

20. The examination structure of claim 18, wherein said underside surface is positioned at an angle between 0 and 90 degrees relative to a horizontal surface of the non-semiconductor layer.

* * * * *

UNITED STATES PATENT AND TRADEMARK OFFICE
CERTIFICATE OF CORRECTION

PATENT NO. : 6,507,044 B1
DATED : January 14, 2003
INVENTOR(S) : Santana, Jr. et al.

It is certified that error appears in the above-identified patent and that said Letters Patent is hereby corrected as shown below:

<u>Column 14,</u>
Line 38, please delete "lower silicon" and substitute -- non-semiconductor --.

Signed and Sealed this

Third Day of June, 2003

JAMES E. ROGAN
*Director of the United States Patent and Trademark Office*